United States Patent [19]

Reyling

[11] 4,333,162

[45] Jun. 1, 1982

[54] BUBBLE MEMORY WITH CONDUCTOR PROGRAMMABLE TRANSPARENT ERROR MAP

[75] Inventor: George F. Reyling, Sunnyvale, Calif.

[73] Assignee: National Semiconductor Corporation, Santa Clara, Calif.

[21] Appl. No.: 174,939

[22] Filed: Aug. 4, 1980

[51] Int. Cl.$^3$ ............................................. G11C 19/08
[52] U.S. Cl. .......................................... 365/15; 365/12
[58] Field of Search ............................. 365/15, 12, 13

[56] References Cited

U.S. PATENT DOCUMENTS 4,139,906 2/1979 Chen ..................................... 365/15
4,187,554 2/1980 Kammann ............................. 365/15

Primary Examiner—James W. Moffitt
Attorney, Agent, or Firm—Brown & Martin

[57] ABSTRACT

Disclosed is a bubble memory having a plurality of data loops, some of which may be defective, and first input and output paths for propagating magnetic bubbles to and from the data loops, respectively. The memory further includes a plurality of redundant loops, and second input and output paths for propagating magnetic bubbles to and from the redundant loops, respectively. A pair of bubble generators are provided for simultaneously generating the same input data stream on both the first and second input paths. By selectively disabling certain first transfer gates associated with the data loops magnetic bubbles are prevented from being transferred into defective ones of the data loops. By selectively enabling certain second transfer gates and certain second replicate gates, magnetic bubbles representing the same information as those not transferred into the data loops can be stored and retrieved from the redundant loops. Magnetic bubbles replicated from the redundant loops are merged into corresponding vacant positions in the output data stream propagated from the data loops before the stream reaches a bubble detector. The gates are selectively disabled or enabled by opening one of two parallel connected conductor segments in each of the gates.

10 Claims, 5 Drawing Figures

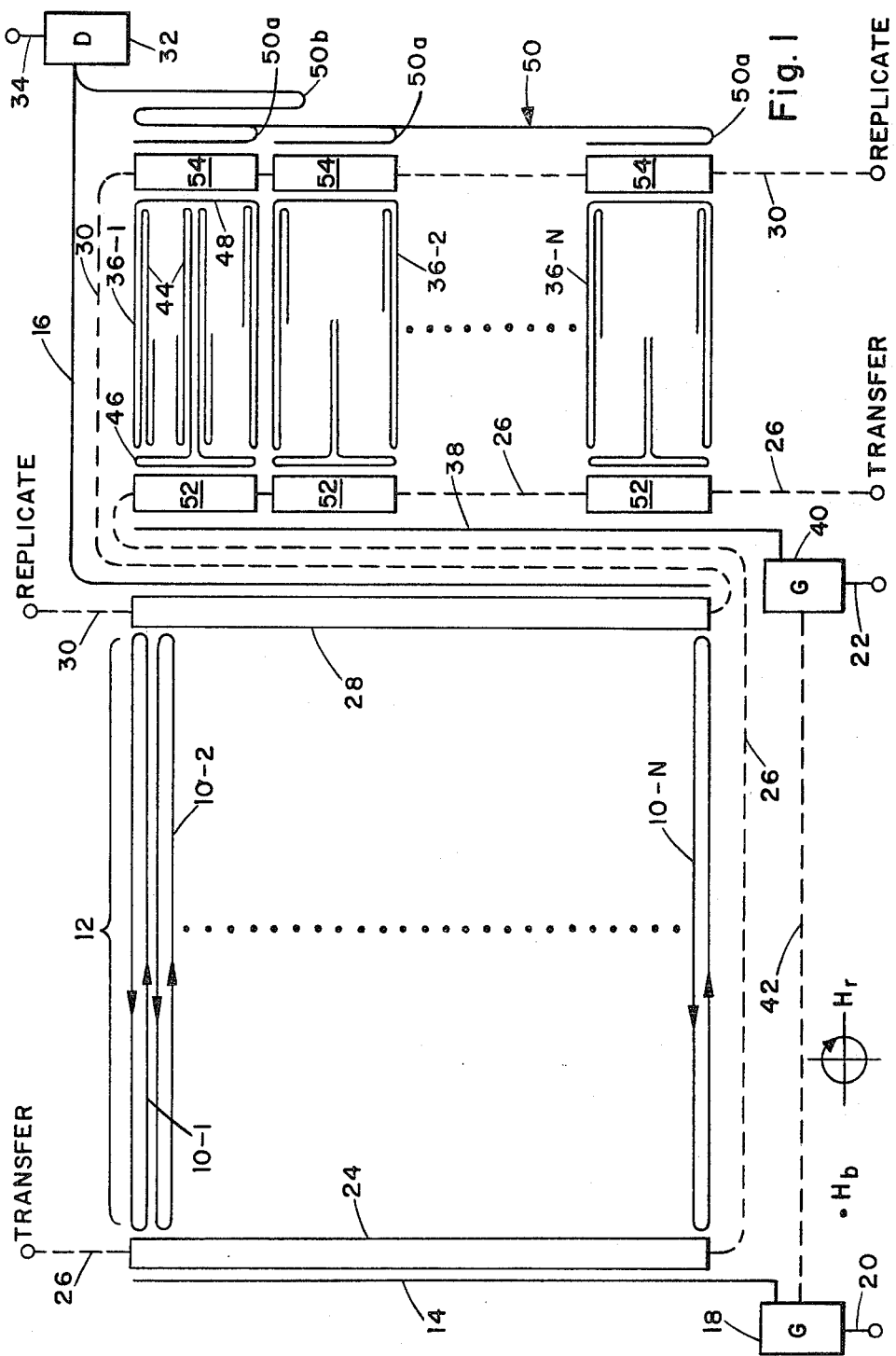

U.S. Patent   Jun. 1, 1982   Sheet 2 of 2   4,333,162
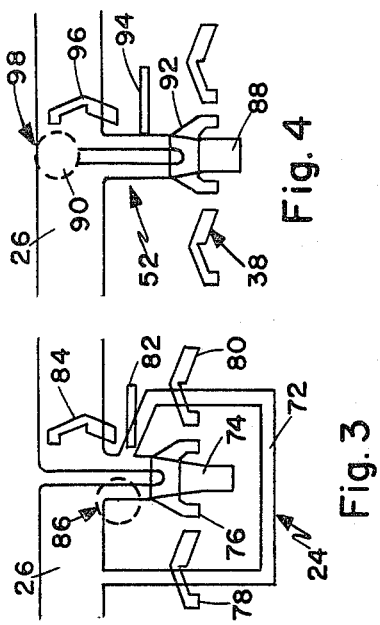
Fig. 3
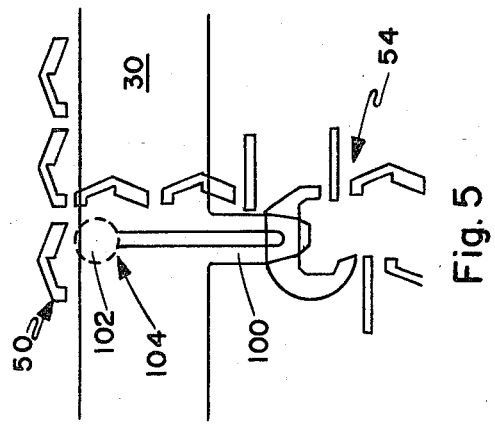
Fig. 4
Fig. 5
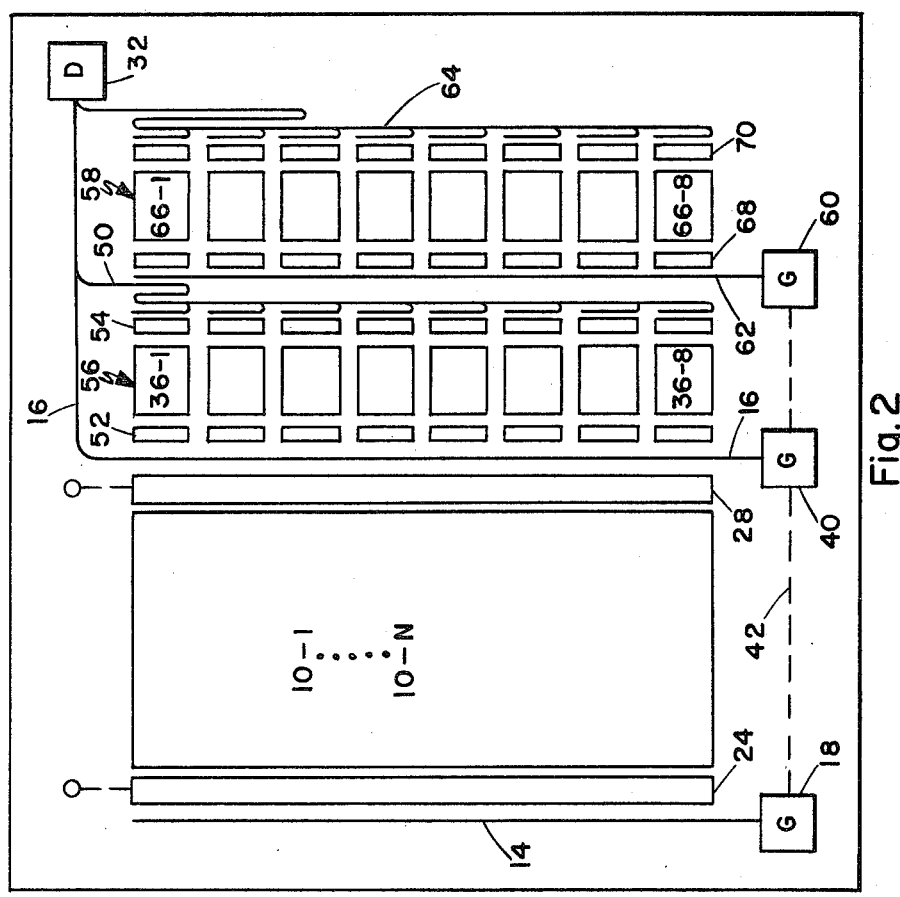
Fig. 2

BUBBLE MEMORY WITH CONDUCTOR PROGRAMMABLE TRANSPARENT ERROR MAP

BACKGROUND OF THE INVENTION

The present invention relates to magnetic bubble memories, and more particularly to methods for routing of data to and from only non-defective minor loops in bubble memories employing redundant minor loops.

Currently, the most popular architecture for magnetic bubble memories is that in which magnetic bubbles are stored in a plurality of parallel minor loops. In a block replicate bubble memory a serial-parallel bubble propagation path is used to transfer bubbles into parallel minor loops, and a parallel-serial bubble propagation path is used to transfer bubbles from the minor loops.

However, due to a variety of causes, some of the minor loops develop defects during their fabrication. For example, the defects may be due to flaws in the garnet film, which resist bubble propagation. They may also be due to permalloy shorts attributable to photolithographic tolerances, or due to dust and other impurities which enter the memory during its fabrication. As a result, some small percentage of the minor loops, such as five percent or less, typically do not work.

To overcome this problem bubble memories are fabricated with extra or so-called redundant minor loops. Then all defective loops, and any good loops in excess of a design number simply are not used during the write and read operations. Suppose for example, that a bubble memory chip was designed to have 256 fault free minor loops. To achieve this, the memory would be built with some larger number of minor loops, such as 270. Then in most cases, at least 256 loops would be fault free.

The problem then becomes one of devising a method for bypassing the defective loops as information is written into and read from the memory. Suppose that in the preceding example, loops ten and one hundred were defective. Under those conditions, no data could be written into the memory on the tenth and one hundredth clocking pulses out of every 270 clocking pulses. Similarly, during a reading operation, the tenth and one hundredth information bits out of every 270 bits of information that are read from the memory must be ignored.

In the past, such control functions have been performed with the aid of external control circuitry. One common prior art control circuitry includes a read only memory (ROM) that is programmed to indicate which of the loops are defective. Address counters simultaneously address both the ROM and the bubble memory. When the ROM output indicates that the bubble memory location being addressed is defective, corrective action is taken. For a discussion of the ROM approach to mask out defective minor loops, see the book entitled *Magnetic-Bubble Memory Technology* written by Hsu Chang, pages 35-36, copyright 1978, and published by Marcel Dekker, Inc.

More recently, some bubble memories have included a single extra loop on the chip for storing error map information therein. The user is thus able to read the error map from the memory during system initialization and the error map is thereafter stored in a random access memory (RAM). The RAM is then used in conjunction with control logic to mask out the defective loops during a write or read operation. Published German patent application No. 2804695 filed by Texas Instruments, Inc. is believed to be illustrative of this last mentioned approach.

Both of the above approaches, however, have certain deficiencies. For example, with the ROM approach, each memory system requires unique parts. That is, the ROM for one memory system cannot be used as the ROM in another system because the bubble memory chips in each memory system have different defective minor loops. Furthermore, when a bubble chip in a memory system goes completely bad, due to aging for example, the replacement of the bubble chip also necessitates the replacement of the ROM.

One problem with the prior art bubble memory chips that provide an on chip error may loop is that they include no redundant error map loops. That is, they include only a single error map loop. If that loop is defective, then the entire chip must be discarded. Thus, the production yield of those bubble memories chips is undesirably low. Furthermore, there is a risk when storing the error map in an extra minor loop that the starting and stopping of the drive field will not be precise with regard to 360° of orientation. Because of this, it is possible for magnetic bubbles of the error map to jump between adjacent permalloy propagation elements when they are not supposed to. This so-called data scrambling results in the loss of the error map.

U.S. patent application Ser. No. 3,651 filed Jan. 15, 1979 of Peter K. George now U.S. Pat. No. 4,228,522, assigned to the assignee of the present application, discloses a bubble memory that includes a plurality of minor loops for storing bubbles representative of data therein, and a pair of minor loops for storing bubbles representative of an error map therein. Proper choice of the number of propagation elements enables the error map to be selectively written into and read from only one loop of the pair of error map loops with only a single control line. This design produces a higher chip yield since the chip can still be used even if one error map loop is defective.

Other patents of interest which deal with the problem of masking out defective minor loops in a magnetic bubble memory are U.S. Pat. Nos. 3,909,810; 4,073,012; and 4,090,251.

One problem with the error map approach to handling defective minor loops is that the added control circuitry increases the cost of the bubble memory system. Furthermore, it increases the complexity of the chip design. Also, frequently the bubble memory chips are not interchangeable. In addition, the operating speed of a bubble memory incorporating the error map approach is slower than it would be if the defects were transparent to the user. Consider again the above described example that had 270 total loops of which only 256 were guaranteed to be non-defective. In that memory, a total of 270 revolutions of an external magnetic drive field are required to load one bubble into each of 256 minor loops. Conversely, if the defective loops were transparent to the user, a total of only 256 rotations of the magnetic field would be required to load one bubble into each of the loops.

In co-pending U.S. patent application Ser. No. 968,172, of George Reyling, filed Dec. 11, 1978 and now U.S. Pat. No. 4,233,670, and assigned to the assignee of the present application, there is described a fault transparent magnetic bubble memory in which magnetic bubbles are routed away from defective minor loops by selectively destroying certain permalloy shorting bars to convert double-distance bubble propagation elements to single-distance bubble propagation elements. This is done in both the serial-parallel input and parallel-serial output propagation paths. As a result, the number of rotations of the magnetic drive field that are required to load one bubble into each of 256 non-defective minor loops and to read one bubble from each of these loops can be reduced to 256. The defective minor loops are determined during the fabrication process and preselected ones of the permalloy elements are destroyed using a computer controlled laser beam. The need for error map storage loops, control circuitry for masking out defective minor loops pursuant to the error map, and complex permalloy patterns for handling the on chip propagation and storage of the error map, is eliminated.

Co-pending U.S. patent application Ser. No. 968,172 describes two different techniques for destroying a selected permalloy element. In one method, a laser beam of sufficient power is applied to the element for sufficient duration so that the permalloy element is vaporized and effectively severed at one point. The other method is to heat the permalloy element with the laser beam to a temperature sufficient to substantially degrade the magnetic properties of the element. This will insure that the element acts as a barrier over which magnetic bubbles will not propagate.

Both of the above-described laser beam approaches to destroying selected permalloy elements in order to mask out the defective minor loops have certain drawbacks. It is difficult to clearly and reproduceably severe a permalloy propagation element on a bubble memory chip with a laser beam. Molten material and gas which are generated upon laser beam cutting, tend to escape violently. This can result in rupturing of overlying materials and contamination of adjacent areas with debris. Frequently, the thermal conductivity of the bubble chips varies from one location to the next. A laser blast that might neatly severe a permalloy element in one area of the chip may not accomplish the same objective with regard to an element in another area of the chip. The laser beam can be automatically driven over different elements via computer control. However, it is not possible to continuously vary the intensity of the beam in accordance with the different thermal conductivities of the chip at different locations. Also since laser cuts are made in areas where magnetic bubbles propagate, there is sometimes localized alteration of magnetic properties. This can reduce the operating margins of the chips.

It would be desirable to provide an improved procedure for implementing on-chip error maps that are transparent to the user. An approach that uses a programmable laser for treating preselected control conductors represents one viable solution. Laser treatment of selected control conductors could be confined to regions where bubbles do not propagate. Thus, if there is localized alteration of magnetic properties due to heating, margins will not be reduced as they would with alteration of selected permalloy elements by heating.

U.S. Pat. No. 4,139,906 of Chen, assigned to Rockwell International Corporation, discloses a conductor programmable switching arrangements for controlling the interaction of magnetic bubble domain propagation loops in order to provide a large, serial storage loop which is fault tolerant. The disclosed memory incorporates a plurality of minor loops each including a switch and positioned adjacent a major loop. Under each switch a control conductor is split into narrow and wide segments. Where a specific minor loop is non-defective, the current through the narrow control conductor segment is insufficient to render two included swap or transfer gates active. Under these conductions the minor loop and the major loop are connected in series. Where a specific minor loop is defective, the wide control conductor segment in its switch is broken by etching, laser scribing, or the like. Then the current flowing through the narrow control conductor segment of that switch is sufficient to cause its two transfer gates to be active. This separates the minor loop and the major loop.

The memory of U.S. Pat. No. 4,139,906 just described has some important drawbacks. First of all, it provides only a single long serial shift register. As is well known it is preferable to use architectures other than a single long serial shift register in order to reduce information access time. The most popular of these reduced access time architectures is the so-called block replicate architecture. Another drawback of the memory disclosed in U.S. Pat. No. 4,139,906 is that the disclosed switch whose condition is determined by the severing or non-severing of a control conductor is relatively complex and requires an undue amount of space and power. Two transfer gates are required for each minor loop. Current must continually flow through the unsevered narrow control conductors during propagation to prevent bubbles from entering defective minor loops. Yet another disadvantage of the memory of U.S. Pat. No. 4,139,906 is that the storage capacity of the serial memory varies drastically with the number of defects.

Therefore it would be desirable to incorporate a conductor programmable error map capability into a bubble memory having a fast access architecture such as a block replicate bubble memory.

SUMMARY OF THE INVENTION

The present invention provides a bubble memory having a plurality of data loops, some of which may be defective, and first input and output paths for propagating magnetic bubbles to and from the data loops, respectively. The memory further includes a plurality of redundant loops, and second input and output paths for propagating magnetic bubbles to and from the redundant loops, respectively. A pair of bubble generators are provided for simultaneously generating the same input data stream on both the first and second input paths. By selectively disabling certain first transfer gates associated with the data loops magnetic bubbles are prevented from being transferred into defective ones of the data loops. By selectively enabling certain second replicate gates, magnetic bubbles representing the same information as those not transferred into the data loops can be stored and retrieved from the redundant loops. Magnetic bubbles replicated from the redundant loops are merged into corresponding vacant positions in the output data stream propagated from the data loops before the stream reaches a bubble detector. The gates are selectively disabled or enabled by opening one of two parallel connected conductor segments in each of the gates.

BRIEF DESCRIPTION OF THE DRAWINGS

FIG. 1 is a schematic diagram of a magnetic bubble memory constructed according to one embodiment of the present invention.

FIG. 2 is a simplified plan view of a magnetic bubble memory constructed according to a second embodiment of the present invention.

FIGS. 3, 4, and 5 are simplified plan views of different gates incorporated in the bubble memory illustrated schematically in FIG. 1.

Unless otherwise indicated, the relative dimensions in the drawings are not to scale. Like reference numerals throughout the figures refer to like parts.

DESCRIPTION OF THE PREFERRED EMBODIMENTS

As is conventional, information storage and retrieval in the magnetic bubble memories hereafter described is accomplished and measured by the presence or absence of magnetic bubble domains which are propagated and manipulated on a chip. The chip includes a plurality of spaced apart permalloy propagation elements which overlie a thin film of garnet. The maintenance and propagation of the magnetic bubble domains along the paths of propagation elements is accomplished through the utilization of in-plane XY rotating magnetic drive field $H_r$ in the presence of a Z bias magnetic field $H_b$ having its lines of force perpendicular to the plane of the garnet film. Magnetic bubble memories of the aforementioned character are generally known as field-access bubble memories. A concise description of the theory and operation of field-access bubble memories together with a discussion of various architectures thereof can be found in the article "Bubble Memories Come to the Boil" which I co-authored with Peter K. George and which was published in the Aug. 2, 1979 issue of ELECTRONICS magazine beginning at page 99.

Referring to FIG. 1, there is illustrated therein a bubble memory constructed according to one embodiment of the present invention. It may be fabricated using conventional techniques and includes the standard monolithic architecture of a conventional field-access bubble memory having control function areas adjacent the peripheral edges of the chip and a storage area in the medial portion of the chip. The sequence of layers from bottom to top may be: garnet film, first layer of silicon dioxide, patterned control conductors, second insulating layer of silicon dioxide, and permalloy propagation elements. The permalloy elements are configured and positioned to define a plurality of paths for propagating magnetic bubbles having a predetermined diameter under the influence of a Z bias magnetic field $H_b$ and a rotating XY drive magnetic field $H_r$. The magnetic bubble memory illustrated in FIG. 1 is essentially a block replicate bubble memory which has been modified to incorporate a conductor programmable error map capability.

Specifically, the memory of FIG. 1 includes a plurality of data loops 10-1, 10-2, . . . 10-N which are located in a medial storage region 12 of the chip. Magnetic bubbles are propagated in these loops in the direction indicated by the arrows in response to the rotating drive field $H_r$. Also included in the memory of FIG. 1 are a first input path 14 for propagating bubbles to the data loops and a first output path 16 for propagating bubbles from the data loops. In FIG. 1, propagation paths are indicated with solid lines and control conductors are indicated with phantom lines.

In the bubble memory of FIG. 1 an input data stream of magnetic bubbles is generated in serial fashion on the input path 14 by a first bubble generator 18. This generator produces bubbles in response to the application of external signals applied to leads 20 and 22. As is conventional in a bubble memory having parallel minor loops connected to serial-parallel input and parallel-serial output propagation paths, the input data stream produced by the first bubble generator 18 may have an idle or unused bit position between each information bit position. The use of such an idle bit position is discussed in U.S. Pat. No. 3,909,810.

In operation, the rotating magnetic drive field $H_r$ propagates the bubbles of the input data stream along the first input path 14 (FIG. 1) until the information bit positions of the stream respectively align with a plurality of first transfer gates 24, there being one such gate for each of the data loops. For simplicity, in FIG. 1 the first transfer gates 24 are illustrated diagrammatically as an elongated rectangle positioned adjacent the first input path 14 and the left-hand ends of the data loops 10-1 to 10-N. As described in more detail hereafter, each of the first transfer gates 24 is normally capable of transferring a bubble from the first input path 14 to a corresponding one of the data loops upon receiving a predetermined transfer-in signal transmitted on a transfer-in control conductor 26. Each of the first transfer gates is adapted to be selectively disabled to prevent transferring of a bubble from the first input path 14 into an adjacent defective data loop upon thereafter receiving the transfer-in signal.

The bubble memory of FIG. 1 further includes a plurality of first replicate gates 28 positioned between the other ends of the data loops 10-1 to 10-N and the first output path 16. These first replicate gates may be of conventional design, there being one such replicate gate for each of data loops 10-1 to 10-N. Each of the first replicate gates is adapted for replicating a bubble onto the first output path 16 from a corresponding one of the data loops upon receiving a predetermined replicate signal transmitted on a replicate control conductor 30. For simplicity the first replicate gates 28 are illustrated in FIG. 1 by an elongate rectangle extending between the first output path 16 and the right-hand ends of the data loops 10-1 to 10-N. Magnetic bubbles replicated onto the first output path 16 are serially propagated to a bubble detector 32 which generates signals representative of the sequence of bubbles received on output leads 34 as the bubbles are detected. The bubble detector 32 may be of conventional design. For example, it may include multiple bubble stretcher stages and a detector stage having a zig-zag magnetoresistive element.

Due to causes previously discussed some of the data loops 10-1 to 10-N may be defective. Where the bubble memory includes a large number of data loops, for example, in excess of 256, it is not uncommon for several of the data loops to be defective. These defective loops can be identified by the manufacturer upon completion of the fabrication process. The present invention provides a way to prevent magnetic bubbles representative of information from being transferred into defective data loops and instead provides a way for other magnetic bubbles representative of the same information to be stored and retrieved from a plurality of redundant loops 36-1 to 36-N (see FIG. 1). The number of redundant loops is substantially less than the number of data loops.

The bubble memory illustrated in FIG. 1 includes a second input path 38 for propagating magnetic bubbles to the redundant loops. A second bubble generator 40 is provided for generating an auxiliary input data stream of magnetic bubbles on the second input path 38. The first bubble generator 18 and the second bubble generator 40 are serially connected through a conductor 42 so that both generators will simultaneously generate the same input data stream of magnetic bubbles on the first and second input paths 14 and 38 in response to signals applied to the leads 20 and 22.

Each of the redundant loops such as 36-1 comprises a plurality of permalloy elements which are preferably positioned and configured to define a folded, serpentine loop. Thus each of the redundant loops, such as the loop 36-1 has a plurality of parallel segments 44 which extend perpendicular to the second input path 38. Each of the redundant loops further includes input and output segments 46 and 48, respectively, which extend parallel to the second input path 38 and a second output path 50. If the redundant loops are folded in the manner indicated, a verticle column of such loops positioned adjacent to each other, hereinafter referred to as a "bank" of redundant loops, will take up a relatively small amount of space. This is important where chip area is at a premium as in the case of most micro-electronic circuits. More importantly, however, when the redundant loops 36-1 to 36-N have a folded serpentine configuration as indicated, a single one of a plurality of second transfer gates and a single one of a plurality of second replicate gates can be selectively enabled to operate with respect to a given redundant loop.

In the bubble memory illustrated in FIG. 1 a plurality of second transfer gates 52 corresponding to each of the redundant loops 36-1 to 36-N are provided. For simplicity in FIG. 1 a plurality of second transfer gates has been illustrated as an elongated rectangle. Each of the second transfer gates is adapted to be selectively enabled as hereafter described to transfer a bubble from the second input path 38 to its corresponding one of the redundant loops upon receiving the predetermined transfer-in signal transmitted on the transfer-in control conductor 26. More specifically, the auxillary input data stream generated by the second bubble generator 40 is propagated along the second input path 38 until each information bit positioned thereon is in alignment with a corresponding one of the second transfer gates. There is one second transfer gate positioned between each information bit position on the second input path 38 and the input segment such as 46 of its corresponding redundant loop such as 36-1. When a given second transfer gate is enabled as hereafter described, pulsing of the transfer-in control conductor 26 will cause a magnetic bubble adjacent to the enabled transfer gate to be transferred onto the input segment of the redundant loop. Thereafter, the bubble is propagated along the redundant loop during rotations of the magnetic drive field $H_r$.

The bubble memory illustrated in FIG. 1 is further provided with a plurality of second replicate gates 54 corresponding to each of the redundant loops 36-1 to 36-N. For simplicity, in FIG. 1 a plurality of the second replicate gates are illustrated as a rectangle. Each of the second replicate gates is adapted to be selectively enabled as hereafter described for replicating a bubble from its corresponding one of the redundant loops onto the second output path upon receiving the replicate signal transmitted on the replicate control conductor 30. When a magnetic bubble which has previously been transferred into one of the redundant loops such as 36-1 is located on the output segment of that loop such as 48, it is adjacent to a particular one of the second replicate gates 54. Where that replicate gate has previously been enabled, pulsing of the replicate control conductor 30 with the appropriate signal will cause that magnetic bubble to be replicated onto a corresponding return leg portion 50a of the second output path 50. Thereafter the magnetic bubble can be propagated along the second output path and merged into the output data stream propagated along the first output path 16. The return leg portions 50a and the reverse folded section 50b of the output path 50 are necessary to insure that bubbles stored in the redundant loops are merged into the proper positions in the output data stream on the output path 16.

The overall operation of the bubble memory of FIG. 1 will now be described in connection with a specific example. Assume that the memory has 356 data loops and 8 redundant loops. Assume further that upon completion of the fabrication process testing reveals that the 10th, 50th, and 200th data loops are defective. Then, as hereafter described, three of the first transfer gates 24, i.e. those corresponding to the 10th, 50th, and 200th data loops, are disabled. In addition, the 10th, 50th, and 200th ones of the second transfer gates 52 and the 10th, 50th, and 200th ones of the second replicate gates 54 are enabled as hereafter described.

During operation of the memory, in the example, identical input data streams are simultaneously generated by the first and second bubble generators 18 and 40 on the first and second input paths 14 and 38, respectively. These data streams are propagated along their respective input paths until each information bit position thereof is in alignment or positioned adjacent to a corresponding one of the first or second transfer gates. Thereafter the transfer-in control conductor 26 is pulsed. Magnetic bubbles representative of information which are in the 10th, 50th, and 200th information bit positions of the data stream on the first input path 14 are not transferred into the defective data loop because the first transfer gates corresponding to the same numbered data loops have previously been disabled. Conversly, magnetic bubbles in the 10th, 50th, and 200th information bit positions of the auxillary input data stream on the second input path 38 are transferred into corresponding ones of the redundant loops since the second transfer gates immediately adjacent thereto have previously been enabled. Successive input data streams are repeatedly generated until major portions of the non-defective data loops and of the three redundant loops which have been utilized are full.

Continuing with the example, when information is to be read from the bubble memory illustrated in FIG. 1, the replicate control conductor 30 is pulsed to replicate a magnetic bubble from each of the non-defective data loops onto the first output path 16. No bubbles are replicated from the 10th, 50th, and 200th data loops since none have been transferred into the same. Pulsing of the replicate control conductor 30 also causes magnetic bubbles to be replicated by the 10th, 50th, and 200th ones of the second replicate gates 54 onto the second output path 50 from the redundant loops corresponding to these second replicate gates. Thereafter, successive revolutions of the drive field $H_r$ cause the output data stream on the first output path 16 to propagate to the detector 32. The same revolutions of the drive field also cause the magnetic bubbles replicated on the second output path 50 to propagate along such path and merge with the output data stream propagated along the first output path 16.

The lengths of the first and second output paths 16 and 50 are correlated and synchronized so that any information stored in the redundant loops is merged into the appropriate vacant information bit positions in the output data stream propagated from the data loops. Thus in the example the redundant loops that are utilized take the place of the defective data loops. The final data stream read by the detector 32 appears the same as if all of the data loops were good and none of the redundant loops were utilized.

In the example just described, each of the eight redundant loops has thirty-two second transfer gates 52 and second replicate gates 54 which correspond thereto. Thus only one defective data loop can occur in each group of thirty-two data loops. In the example given, if the memory had two defective loops separated by less than thirty-two non-defective loops the memory data could not be made transparent to defects simply by enabling and disenabling selected ones of the gates. Instead some other conventional approach would have to be followed in order to enable the memory to be utilized. One such approach would be to store an error map in an external ROM and to provide control circuitry for skipping the defective loops during both write and read operations. However, the probability that two defective loops would be separated by less than thirty-two non-defective loops in the memory is relatively low. In most instances the memory could be made transparent by enabling and disabling selected gates.

Multiple banks of redundant loops may be utilized to permit even greater frequencies of defective data loops to be accommodated. A second embodiment of the present invention is illustrated in FIG. 2. It is similar in all respects to the embodiment illustrated in FIG. 1 except that it has two banks 56 and 58 of eight folded redundant loops each. It also has three serially connected bubble generators, 18, 40 and 60, and various input and output paths, gates and control conductors so that the memory functions essentially in the same fashion as that illustrated in FIG. 1. Specifically the memory in FIG. 2 has a third input path 62 and a third output path 64 which extend past eight redundant loops 66-1 to 66-8. A plurality of third transfer gates 68 similar to the second transfer gates 52 correspond to each one of the redundant loops 66-1 to 66-8. A plurality of third replicate gates 70 similar to the second replicate gates 54 correspond to each one of the redundant loops 66-1 to 66-8.

FIGS. 3-5 illustrate preferred forms for the construction of the various gates incorporated in the memory of FIG. 1 which are adapted to be selectively disabled or selectively enabled. FIG. 3 illustrated a preferred form of one of the first transfer gates 24. It includes first and second parallel connected conductor segments 72 and 74 which are connected to the transfer-in control conductor 26 as shown. These conductor segments, like the conductor 26, may be made of AlCu or gold. They are typically photolithographically delineated prior to the deposition of an insulating layer on top of which are formed the permalloy propagation elements. In FIG. 3, the half-disk permalloy element 76 and the assymmetric chevron permalloy elements 78 and 80 form part of the first input path 14 as is conventional. Permalloy elements 82 and 84 lead to one of the data loops. The first and second conductor segments are configured and dimensioned to permit selective disablement. Normally when the transfer-in signal is received from the conductor 26 an adjacent magnetic bubble situated centrally on the half-disk element 76 will be transferred during subsequent revolutions of the drive field $H_r$ along the elements 82 and 84 to the corresponding data loop. For example, the length and width of the segments 72 and 74 can be made such that the segment 72 has about five times the resistance of the segment 74. If the second segment 74 is severed or opened, e.g. in a region 86 circled with phantom lines then all the current of the transfer-in signal will flow in the segment 72 and no bubble will be transferred from the permalloy element 76 into the corresponding data loop. The segment 74 can be opened by any suitable method such as by severing the same with a laser beam. Laser scribing of microelectronic circuits is a well known technique. Thus the first transfer gate 24 illustrated in FIG. 3 is normally capable of transferring a bubble from the first input path 14 into a corresponding one of the data loops upon receiving the transfer-in signal on the conductor 26. The gate 24 is adapted to be selectively disabled to prevent transferring a bubble upon receiving the transfer-in signal if the corresponding data loop is defective.

FIG. 4 illustrates a preferred form for one of the second transfer-in gates 52 which is adapted to be selectively enabled to transfer a bubble from the second input path 38 (FIG. 1) to its corresponding one of the redundant loops 36-1 to 36-N upon receiving the transfer-in signal transmitted on the conductor 26. The second transfer gate illustrated in FIG. 4 operates in a fashion converse to that of the first transfer gate 24 illustrated in FIG. 3. The second transfer gate 52 includes first and second parallel connected conductor segments 88 and 90. These segments are positioned adjacent the second input path 38 and the input segment of its corresponding one of the redundant loops. The first and second segments 88 and 90 have predetermined configurations and dimensions to permit selective enablement. Normally when the transfer-in signal is transmitted along the conductor 26 a bubble centrally positioned on the half-disk permalloy element 92 of the second input path 38 will not be transferred to the corresponding one of the redundant loops. However, when the second conductor segment 90 of the gate 52 is opened in a region 98 and the tranfer-in signal is thereafter transmitted along the conductor 26 a bubble on the half-disk element 92 will be transferred to the corresponding adjacent one of the redundant loops by traveling along the elements 94 and 96 during successive revolutions of the drive field $H_r$. By way of example, in FIG. 4, segments 88 and 90 may be dimensioned so that the segment 88 has about twenty times the resistance of the segment 90. Not enough current flows in the segment 88 to transfer a magnetic bubble unless the segment 90 is opened in the region 98 by any suitable technique such as by severing the same with a laser beam.

FIG. 5 illustrates a preferred form for one of the second replicate gates 54. This gate is adapted to be selectively enabled for replicating a bubble from a corresponding one of the redundant loops 36-1 to 36-N (FIG. 1) onto the second output path 50 upon receiving the replicate signals transmitted on the replicate control conductor 30. The second replicate gate 54 includes first and second parallel connected conductor segments 100 and 102 which join portions of the replicate control conductor 30. These conductor segments are positioned adjacent the second output path 50 and the output segment of the corresponding one of the redundant loops 36-1 to 36-N. The first and second segments 100 and 102 have predetermined configurations and dimensions to permit selective enablement. Normally when the replicate signal is transmitted on the conductor 30 an adjacent bubble in the corresponding one of the redundant loops will not be replicated onto the second output path 50. When the conductor segment 102 is opened in the region 104 and the segments thereafter receive the replicate signal an adjacent bubble in the corresponding one of the redundant loops will be replicated onto the second output path 50. By way of example, the resistance of the first conductor segment 100 may be approximately twenty times the resistance of the second conductor segment 102.

Having described preferred embodiments of the present invention it will be apparent to those skilled in the art that the invention permits of modification in both arrangement and detail. Therefore, my invention should be limited only in accordance with the scope of the following claims.

I claim:

1. A magnetic bubble memory comprising:
   a plurality of data loop means, some of which may be defective, for storing magnetic bubbles representative of information therein;
   first input path means for propagating bubbles to the data loop means;
   a plurality of first transfer gates each normally capable of transferring a bubble from the first input path means to a corresponding one of the data loop means upon receiving a transfer-in signal and adapted to be selectively disabled to prevent transferring a bubble into a defective data loop means upon receiving the transfer-in signal;
   first output path means for propagating bubbles from the data loop means;
   a plurality of first replicate gates each for replicating a bubble onto the output path means from a corresponding one of the data loop means upon receiving a replicate signal;
   a plurality of redundant loop means for storing magnetic bubble representative of information therein;
   second input path means for propagating magnetic bubbles to the redundant loop means;
   a plurality of second transfer gates corresponding to each of the redundant loop means, each of the second transfer gates adapted to be selectively enabled to transfer a bubble from the second input path means to its corresponding one of the redundant loop means upon receiving the transfer-in signal;
   second output path means for propagating bubbles from the redundant loop means and merging them with bubbles propagated on the first output path means;
   a plurality of second replicate gates corresponding to each of the redundant loop means, each of the second replicate gates adapted to be selectively enabled for replicating a bubble from its corresponding one of the redundant loop means onto the second output path means upon receiving the replicate signal; and
   means for simultaneously generating the same input data stream of magnetic bubbles on both the first and second input path means.

2. A magnetic bubble memory according to claim 1 wherein the data loop means, the redundant loop means, the first and second input path means, and the first and second output path means each comprise a plurality of permalloy elements overlying a garnet film, the elements being configured and positioned to permit propagation of magnetic bubbles along paths defined thereby under the influence of a magnetic Z bias field and a rotating magnetic XY drive field.

3. A magnetic bubble memory according to claim 2 wherein each of the first transfer gates includes;
   first and second parallel connected conductor segments positioned adjacent the first input path means and the corresponding one of the data loop means,
   the first and second segments having predetermined configurations and dimensions so that
   normally when the transfer-in signal is received thereby an adjacent bubble on the first input path means will be transferred to the corresponding one of the data loop means, and
   so that when a predetermined one of the first and second conductor segments is opened and the segments thereafter receive the transfer-in signal an adjacent bubble on the first input path means will not be transferred to the corresponding one of the data loops.

4. A magnetic bubble memory according to claim 2 wherein each of the second transfer gates includes:
   first and second parallel connected conductor segments positioned adjacent the second input path means and the corresponding one of the redundant loop means,
   the first and second segments having predetermined configurations and dimensions so that
   normally when the transfer-in signal received thereby an adjacent bubble on the second input path means will not be transferred to the corresponding one of the redundant loop means, and
   so that when a predetermined one of the first and second conductors is opened and the segments thereafter receive the transfer-in signal an adjacent bubble on the second input path means will be transferred to the corresponding one of the redundant loop means.

5. A magnetic bubble memory according to claim 2 wherein each of the second replicate gates include:
   first and second parallel connected conductor segments positioned adjacent the second output path means and the corresponding one of the redundant loop means,
   the first and second segments having predetermined configurations and dimensions so that
   normally when the replicate signal is received thereby an adjacent bubble in the corresponding one of the redundant loop means will not be replicated onto the second output path means, and
   so that when a predetermined one of the first and second conductor segments is opened and the segments thereafter receive the replicate signal an adjacent bubble in the corresponding one of the redundant loop means will be replicated onto the second output path means.

6. A magnetic bubble memory according to claim 2 wherein the redundant loop means comprise a plurality of the permalloy elements which define a folded serpentine loop.

7. A magnetic bubble memory according to claim 1 wherein the simultaneous generating means includes a pair of serially connected bubble generators each adapted to generate the same input data stream onto one of the first and second input path means in response to the application of predetermined control signals thereto.

8. A magnetic bubble memory according to claim 1 wherein a common transfer-in control conductor serially interconnects the first and second transfer gates.

9. A magnetic bubble memory according to claim 1 wherein a common replicate control conductor serially interconnects the first and second replicate gates.

10. A magnetic bubble memory according to claim 1 wherein the storage capacity of each of the data loop means equals that of each of the redundant loop means.

* * * * *